(12) United States Patent
Takahashi et al.

(10) Patent No.: US 7,164,193 B2
(45) Date of Patent: Jan. 16, 2007

(54) OPTICAL SEMICONDUCTOR APPARATUS

(75) Inventors: Seiji Takahashi, Osaka (JP); Takeshi Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/134,622

(22) Filed: May 20, 2005

(65) Prior Publication Data

US 2006/0081866 A1 Apr. 20, 2006

(30) Foreign Application Priority Data

May 21, 2004 (JP) ............................. P2004-152407

(51) Int. Cl.
- *H01L 27/15* (2006.01)
- *H01L 23/02* (2006.01)
- *H01J 5/00* (2006.01)

(52) U.S. Cl. .......................... 257/678; 257/81; 257/99; 257/182; 257/431; 257/432; 257/433; 257/434; 174/50; 174/50.51; 174/50.54; 174/520

(58) Field of Classification Search ................ 257/81, 257/731, 98–100, 182, 678, 432–435, 684, 257/699, 700, 709, E33.058, 924; 361/807, 361/809, 811–813, 708; 174/50.53–50.54, 174/50.63, 51, 520, 527–541

See application file for complete search history.

(56) References Cited

U.S. PATENT DOCUMENTS

| | | | | |
|---|---|---|---|---|
| 4,768,070 A | * | 8/1988 | Takizawa et al. | 372/31 |
| 5,985,696 A | * | 11/1999 | Brunner et al. | 438/116 |
| 6,034,424 A | * | 3/2000 | Fujimura et al. | 257/696 |
| 6,707,073 B1 | * | 3/2004 | Yamamoto et al. | 257/99 |
| 7,026,655 B1 | * | 4/2006 | Go et al. | 257/81 |

FOREIGN PATENT DOCUMENTS

JP 10-051024 2/1998

* cited by examiner

*Primary Examiner*—Jasmine Clark
(74) *Attorney, Agent, or Firm*—Fish & Richardson P.C.

(57) ABSTRACT

An optical semiconductor apparatus has an eyelet having a through hole, an insulating member provided in the through hole, a semiconductor optical element, and a submount on which the semiconductor optical element is mounted. The insulating member supports a plurality of lead terminals. The submount has a first portion supported by the eyelet, a second portion supported by the eyelet, and a third portion disposed between the first portion and the second portion and located above the insulating member. The semiconductor optical element is provided on the third portion of the submount.

27 Claims, 7 Drawing Sheets

(a)

(b)

OPTICAL SEMICONDUCTOR APPARATUS

BACKGROUND OF THE INVENTION

1. Field of the Invention

The present invention relates to an optical semiconductor apparatus.

2. Related Background Art

For achieving multichannel transmission in optical CATV, there are recent demands for optical semiconductor apparatuses capable of transmission of signals in a wide frequency band. For achieving the signal transmission in the wide frequency band, it is necessary to decrease the capacitance of a package of the optical semiconductor apparatus and thereby to provide the optical semiconductor apparatus with fast responsiveness. Patent Document 1 (Japanese Patent Application Laid-Open No. 10-51024) describes an optical semiconductor apparatus. FIG. 7 shows the optical semiconductor apparatus disclosed in Patent Document 1. The optical semiconductor apparatus 701 includes an L-shaped lead pin 703 an end portion of which is bent to form it. The lead pin 703 has a mount surface 705 provided on a side face of the end portion 703a. A semiconductor optical element 707 is mounted on the mount surface 705 without a submount provided therebetween. Since the optical semiconductor apparatus 701 is constructed without the submount, the capacitance of the package becomes small. In the optical semiconductor apparatus 701, the package-anode capacitance and the package-cathode capacitance are reduced well.

SUMMARY OF THE INVENTION

In the optical semiconductor apparatus 701, however, when the semiconductor optical element 707 is die-bonded to the mount surface 705, force is exerted on the end portion 703a of the lead pin 703. This force can bend or plastically deform the end portion 703a to deviate position and angle of the semiconductor optical device 707. This bend or deformation makes it harder for the degree of parallelization of the mount surface 705 to fall within a desired range, and thus it is not easy to obtain the accuracy of the position and angle of the semiconductor optical device 707. In addition, heat in the die bonding step and ultrasonic wave in a wire bonding step cannot be transmitted well to the semiconductor optical device 707 in the mounting thereof, and it is not easy to obtain fabrication conditions suitable for the semiconductor optical element 707 in the die bond step and the wire bond step.

It is an object of the present invention to provide an optical semiconductor apparatus having a structure capable of reducing a parasitic capacitance. It is another object of the present invention to provide an optical semiconductor apparatus having a structure capable of improving the accuracy of the position and angle of the semiconductor optical element. Furthermore, it is still another object of the present invention to provide an optical semiconductor apparatus having a structure capable of achieving stabilization of assembly conditions for the semiconductor optical element.

An optical semiconductor apparatus according to an aspect of the present invention comprises: an eyelet having a through hole; an insulating member provided in the through hole, the insulating member supporting a plurality of lead terminals; a submount having a first portion supported by the eyelet, a second portion supported by the eyelet, and a third portion provided between the first portion and the second portion, the third portion being located above the insulating member; and a semiconductor optical element mounted on the third portion of the submount.

The optical semiconductor apparatus of the present invention further comprises an additional lead terminal electrically connected to the eyelet.

In the optical semiconductor apparatus of the present invention, the submount has: a first face supported by the eyelet; a second face opposite to the first face; a first conductive pattern provided on the first face in the first portion; a second conductive pattern provided on the first face in the second portion; and a third conductive pattern provided on the second face in the third portion. The semiconductor optical element is provided on the third conductive pattern.

In the optical semiconductor apparatus of the present invention, preferably, a sum of a capacitance between the first conductive pattern and the third conductive pattern of the submount and a capacitance between the second conductive pattern and the third conductive pattern of the submount is not more than 0.08 pF. This configuration reduces influence on high-frequency characteristics.

In the optical semiconductor apparatus of the present invention, the first face in the third portion of the submount is spaced apart from the insulating member.

In the optical semiconductor apparatus of the present invention, one lead terminal of the plurality of lead terminals is connected to the semiconductor optical element. Another lead terminal of the plurality of lead terminals is connected to the third conductive pattern.

The optical semiconductor apparatus of the present invention further comprises a lens optically coupled to the semiconductor optical element; and a cap mounted on the eyelet. The cap holds the lens. The third portion of the submount is located between the lens and the insulating member. The third portion of the submount is spaced apart from the insulating member.

In the optical semiconductor apparatus of the present invention, the submount further includes a fourth portion provided between the first portion and the third portion, and a fifth portion provided between the second portion and the third portion. The first to fifth portions constitute a base of the submount. The base is made of an insulating material. The insulating material of the base is exposed in surfaces of the fourth and fifth portions.

Material of the base of the submount is preferably at least one selected from aluminum nitride, CBN, vapor-phase synthetic diamond, SiC, alumina, and single crystal silicon. The submount made of one of these materials has high thermal conductivity. When the material of the base of the submount is at least either of aluminum nitride and alumina, the workability of the submount is improved.

The production cost of the submount can be reduced if the material of the submount is at least one selected from aluminum nitride, alumina, single crystal silicon, and glass (e.g., pyrex glass or silica glass).

If the material of submount is SiC, the difference between the coefficient of linear expansion of the optical semiconductor element (e.g., the coefficient of thermal expansion of InP or GaAs) and the coefficient of linear expansion of the submount is small.

In the optical semiconductor apparatus of the present invention, the semiconductor optical element is a PIN photodiode. This optical semiconductor apparatus enhances the accuracy of the position and angle of the PIN photodiode.

In the optical semiconductor apparatus of the present invention, the semiconductor optical element is an avalanche photodiode. The optical semiconductor apparatus of the present invention reduces the capacitance of the package and enhances the accuracy of the position and angle of the avalanche photodiode.

In the optical semiconductor apparatus of the present invention, the semiconductor optical element has an InGaAs light receiving layer. This configuration of the semiconductor optical element provides a light receiving element suitable for long-wavelength-band optical communications in 1.0–1.6 μm bands.

In the optical semiconductor apparatus of the present invention, the semiconductor optical element has an InP substrate, an InP buffer layer provided between the InP substrate and the InGaAs light receiving layer, and an InP window layer provided on the InGaAs light receiving layer.

In the optical semiconductor apparatus of the present invention, the InGaAs light receiving layer of the semiconductor optical element has a first region, and a second region surrounding the first region. The semiconductor optical element includes a first pn junction provided in the first region, and a second pn junction provided in the second region.

In the optical semiconductor apparatus of the present invention, the semiconductor optical element is a vertical cavity surface emitting laser diode. This configuration provides a low power light emitting element suitable for optical communications.

In the optical semiconductor apparatus of the present invention, the surface emitting laser diode has an active layer of a GaInNAs/GaAs quantum well structure. This configuration provides a light emitting element suitable for long-wavelength-band optical communications in 1.0–1.6 μm bands.

In the optical semiconductor apparatus of the present invention, the surface emitting laser diode has an active layer of a GaAsSb/GaAs quantum well structure. This optical semiconductor apparatus provides a light emitting element suitable for long-wavelength-band optical communications in 1.0–1.6 μm bands.

In the optical semiconductor apparatus of the present invention, the surface emitting laser diode has an active layer of a GaInAs/GaAs quantum dot structure. This optical semiconductor apparatus provides a light emitting element suitable for long-wavelength-band optical communications in 1.0–1.6 μm bands.

DETAILED DESCRIPTION OF THE PREFERRED EMBODIMENTS

Embodiments of the present invention will be described with reference to the drawings. When possible, parts identical to each other will be referred to with reference symbols identical to each other.

Figure 1:
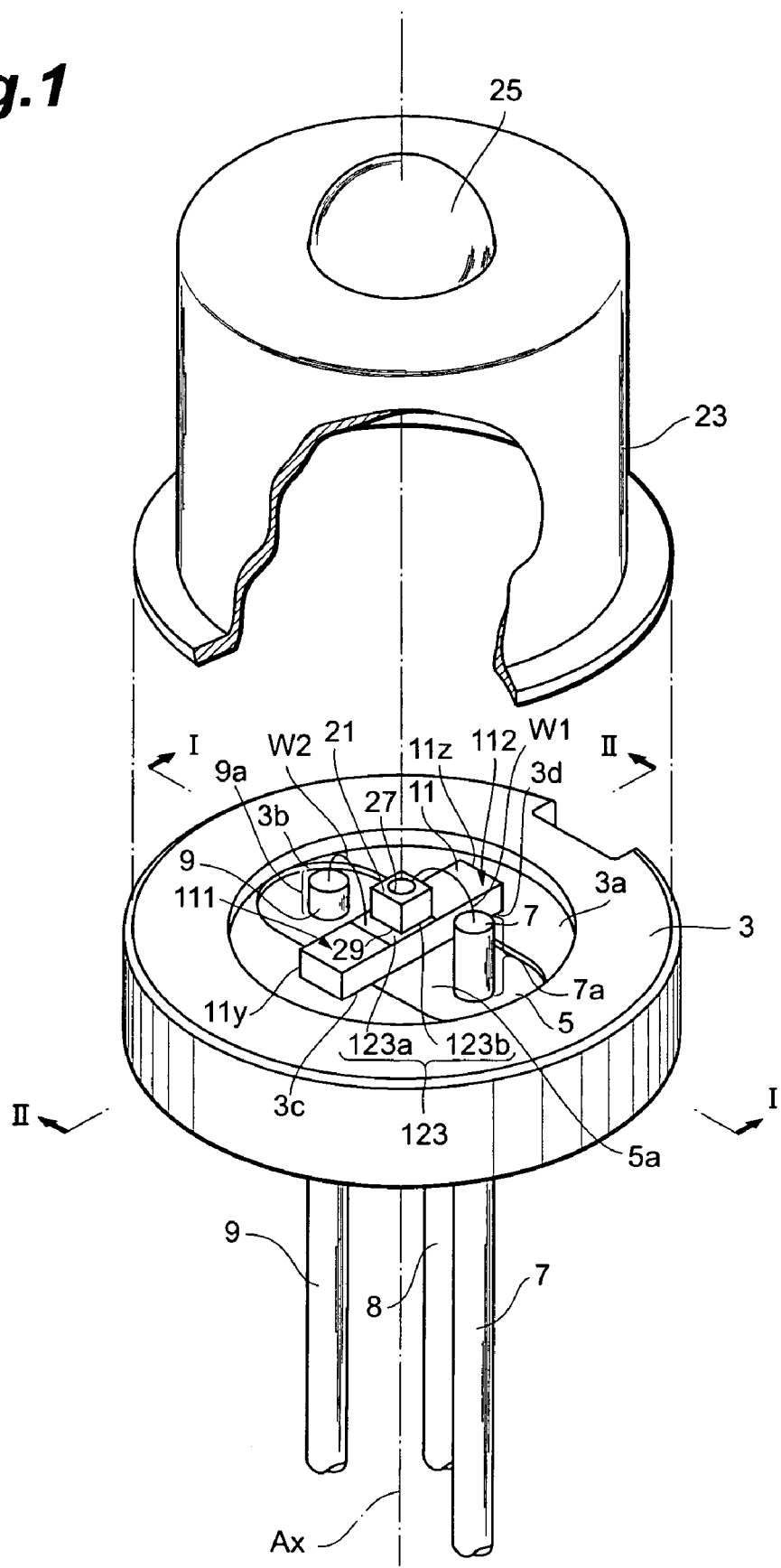
FIG. 1 is a perspective view of an optical semiconductor apparatus according to an embodiment.
Figure 2:
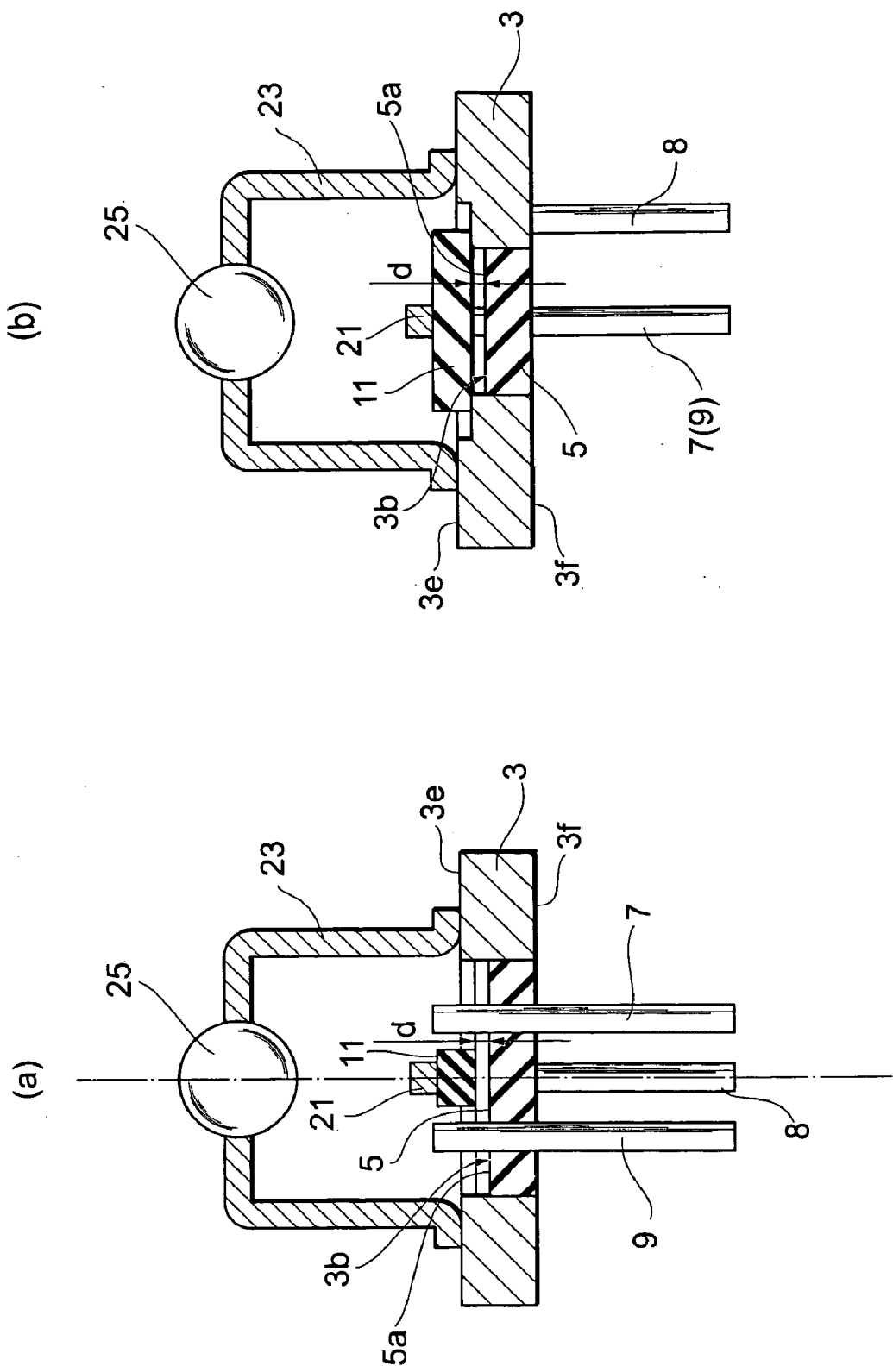
FIG. 2 is a view showing the optical semiconductor apparatus according to the embodiment, wherein area (a) shows a sectional view of the optical semiconductor apparatus taken along line I—I and area (b) shows a sectional view of the optical semiconductor apparatus taken along line II—II.

FIG. 1 is a perspective view showing an optical semiconductor apparatus according to one embodiment of the present invention. Area (a) in FIG. 2 shows a sectional view of the optical semiconductor apparatus taken along line I—I shown in FIG. 1, and area (b) in FIG. 2 shows a sectional view of the optical semiconductor apparatus taken along line II—II shown in FIG. 1. Cross sections of major components in the optical semiconductor apparatus are shown in FIG. 2. The optical semiconductor apparatus 1 includes an eyelet 3. The eyelet 3 has a principal surface 3a extending along a plane intersecting with a predetermined axis Ax. A through hole 3b penetrating the eyelet 3 in the extending direction of the predetermined axis Ax is located in the central region of the eyelet 3. The through hole 3b is, for example, oval-shaped. For example, the longitudinal dimension of the through hole 3b is 3.4 mm and the width of the through hole 3b is 1.4 mm. Parts of the principal surface 3a beside the through hole 3b function as support faces 3c and 3d for supporting a submount 11, which will be described later. As shown in area (b) of FIG. 2, the through hole 3b extends from an end face 3e to another end face 3f of the eyelet 3. The eyelet 3 is plate-shaped; for example, it is formed in a disk of 5.4 mm in diameter and 1.1 mm in thickness. The eyelet 3 is made, for example, of a metal material such as stainless steel, copper, or iron.

The whole of the through hole 3b is filled with the insulating member 5. A step is provided between the upper face 5a of the insulating member 5 and the principal surface 3a, and the upper face 5a of the insulating member 5 is lowered with reference to the principal surface 3a. The insulating member 5 supports lead terminals 7 and 9. The lead terminals 7 and 9 are provided in parallel with each other and extend through the insulating member 5 in the direction of the predetermined axis Ax. The material of the insulating member 5 is, for example, glass or the like. This glass material is used for seal. A lead terminal 8 extends from the bottom surface of eyelet 3. The lead terminal 8 is electrically connected to the eyelet 3 and is used, for example, as a ground terminal. When the lead terminal 8 is connected as a ground terminal to the ground, the submount 11 has no effect of capacitance, thereby permitting the stabilization of the characteristics of semiconductor optical element 21.

The submount 11 is provided on the eyelet 3 across the through hole 3b. The two ends of the submount 11 (e.g., first portion 111 and second portion 112 shown in FIG. 3) are supported by support faces 3c and 3d of the eyelet 3, respectively. The submount 11 is located between the lead terminal 7 and lead terminal 9, which project from the insulating member 5. As shown in area (a) and area (b) of FIG. 2, a space "d" is formed between the submount 11 and the insulating member 5.

The semiconductor optical element 21 is covered with a cap 23. The cap 23 has a tubular shape. One end of the cap 23 holds a lens 25. The other end of the cap 23 is provided on the eyelet 3. The cap 23 is positioned relative to the eyelet 3 so that the other end of the cap 23 is in contact with the principal surface 3a of the eyelet 3. The semiconductor optical element 21 is hermetically enclosed by the eyelet 3, insulating member 5 and cap 23. The cap 23 is made, for example, of a metal material, such as stainless steel, iron, an iron nickel alloy or brass.

The submount 11 will be described with reference to FIG. 3. The submount 11 has a first portion 111, a second portion 112, and a third portion 113. The third portion 113 is provided between the first portion 111 and the second portion 112 and is located in the center of the submount 11. The submount 11 has a first face 11a supported by the eyelet 3 and a second face 11b which is opposite to the first face 11a. The submount 11 has a base 12 made, for example, of an electrically insulating material, such as aluminum nitride, cubic boron nitride (hereinafter referred to as "CBN"), vapor-phase synthetic diamond, silicon carbide (hereinafter referred to as "SiC"), alumina, single crystal silicon, or glass. The physical properties of these materials are presented in Table 1.

provided between the first portion 111 and the third portion 113, and a fifth portion 115 provided between the second portion 112 and the third portion 113. The first to fifth portions 111 to 115 constitute the base 12 of the submount 11. Neither first to third conductive patterns 121–123 nor any other conductive pattern are provided on the fourth portion 114 and the fifth portion 115. For this reason, the base is exposed in the surfaces of the fourth and fifth portions 114 and 115.

In this optical semiconductor apparatus 1, the semiconductor optical element 21 is mounted on the third portion 113 located between first portion 111 and second portion 112 of the submount 11, and the first portion 111 and second portion 112 of the submount 11 are supported on the eyelet. Even if the submount 11 receives force applied between the first portion 111 and the second portion 112 in the die bond step of bonding the semiconductor optical element 21 to the third portion 113, the eyelet 3 supports the first portion 111 and second portion 112 of the submount 11 and thus the die

TABLE 1

| | | Vapor-Phase Synthetic Diamond | Single Crystal Silicon | SiC | cBN | Aluminum Nitride | Alumina | InP | GaAs | Pyrex | Silica Glass |
|---|---|---|---|---|---|---|---|---|---|---|---|
| Density | (g/cm$^3$) | 3.52 | 2.42 | 3.16 | 3.48 | 3.4 | 3.86 | 4.787 | 5.316 | 2.23 | 2.20 |
| Thermal Conductivity | (W/m · K) | 2000–15000 | 150 | 360 | 1300 | 170 | 22 | 70 | 45.5 | 1.1 | 0.55–0.75 |
| Relative Permittivity | | 5.68 | 11.7 | 9.7 | 7.1 | 9.2 | 9.4 | 12 | 11.1 | 4.6 | 1.458 |
| Coefficient of Linear Expansion | (10$^{-6}$) | 1.0 | 2.33 | 3.7 | 2.2–7.5 | 4.8 | 7.2 | 4.5 | 5.93 | 3.2 | 0.5 |

According to thermal conductivity values listed in Table 1, it is preferable that the base 12 of submount 11 be made of at least one of the following materials: aluminum nitride; CBN; vapor-phase synthetic diamond; SiC; alumina; or single crystal silicon. Since the submount 11 made of material in the above table has high heat transference performance, the heat radiation for the semiconductor optical element 21 becomes better, thereby improving the temperature characteristics. Among the above materials, it is preferable to use aluminum nitride or alumina, which facilitates the processing of the submount 11. It is also preferable to use aluminum nitride, alumina, single crystal silicon, or glass (e.g., pyrex glass or silica glass) as a material of the submount 11, which can reduce the production cost of the submount 11. With use of these materials, the production cost of the submount 11 is decreased in descending order of glass, alumina, aluminum nitride, and single crystal silicon. According to coefficients of linear expansion listed in Table 1, if the submount 11 is made of SiC, the difference between the coefficient of linear expansion of the submount 11 and that of the semiconductor optical element 21 (e.g., the coefficient of linear expansion of InP or GaAs) becomes smaller, thereby decreasing residual stress in the mounting step. This material improves the reliability and is thus preferred.

For example, the submount 11 extends in one direction and has one end portion 11y and other end portion 11z. The submount 11 is formed in a rectangular parallelepiped shape, for example, in the size of 2.0 mm×0.8 mm×1.0 mm.

Figure 3:
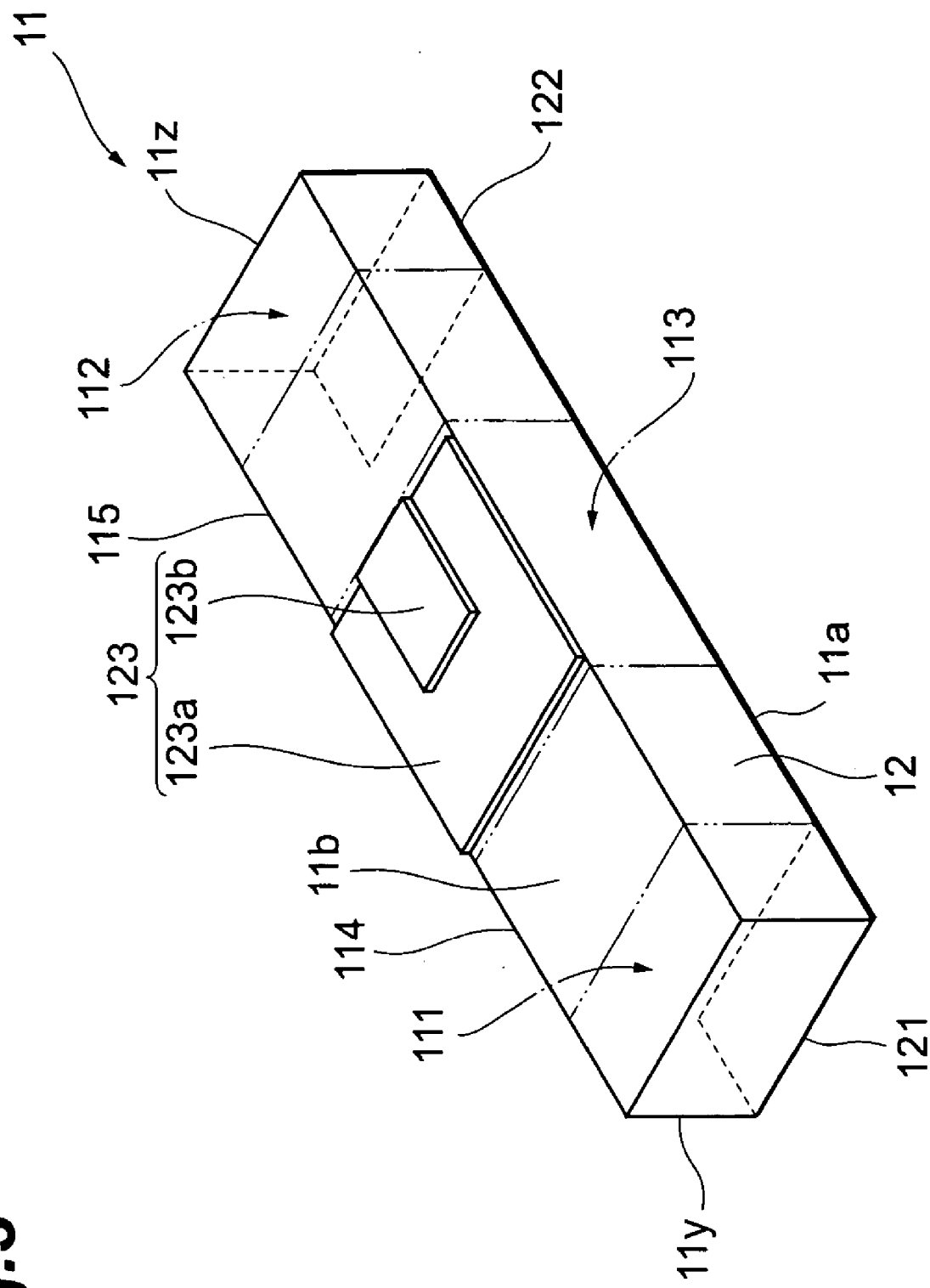
FIG. 3 is a perspective view showing a submount.

As shown in FIG. 3, the submount 11 has a first conductive pattern 121 provided on the first face 11a of the first portion 111, a second conductive pattern 122 provided on the first face 11a of the second portion 112, and a third conductive pattern 123 provided on the second face 11b of the third portion 113. The submount 11 has a fourth portion 114 bonding does not cause any deformation of the bonded portion which is caused in the conventional optical semiconductor apparatus 701, thereby preventing deviation of the position and angle of the semiconductor optical element 21. Furthermore, it becomes easier to apply the heat and ultrasonic wave for mounting the semiconductor optical element 21 to the bonding portion of the semiconductor optical element 21, which facilitates control on the mounting conditions.

The first conductive pattern 121 and second conductive pattern 122 are formed, for example, in the structure of Ti/Au and AuSn. The first conductive pattern 121 is located between the support face 3c of the eyelet 3 and the first face 11a of the submount and is bonded to the support face 3c with adhesive, e.g., solder. The second conductive pattern 122 is located between the support face 3d of the eyelet 3 and the first face 11a of the submount and is bonded to the support face 3d with adhesive, e.g., solder. The dimensions of the first conductive pattern 121 and second conductive pattern 122 are, for example, 0.8 mm×0.3 mm.

The third conductive pattern 123 has a first portion 123a and a second portion 123b. The second portion 123b is provided on the first portion 123a and covers a part of the first portion 123a. A bonding wire W2 (shown in FIG. 1) is bonded to the first portion 123a and the first portion 123a is electrically connected through the wire W2 to the lead terminal 9. The semiconductor optical element 21 (shown in FIG. 1) is mounted on the second portion 123b. The first portion 123a is made of, for example, metal such as Ti/Pt/Au, and the dimensions of the first portion 123a are, for example, 0.8 mm×0.8 mm. The second portion 123b is formed on the first portion 123a and is made, for example, of metal such as AuSn. The dimensions of the second portion 123b are, for example, 0.45 mm×0.45 mm.

In the submount 11, it is preferable that the sum of the capacitance between the first conductive pattern 121 and the third conductive pattern 123 and the capacitance between the second conductive pattern 122 and the third conductive pattern 123 be not more than 0.08 pF. The above example of the submount 11 having the conductive patterns permits the capacitance of not more than 0.08 pF.

Referring again to FIG. 1, the semiconductor optical element 21 is mounted on the second portion 123b of the third conductive pattern 123 of the submount 11. The semiconductor optical element 21 is, for example, a semiconductor light receiving element such as a PIN photodiode or an avalanche photodiode. Alternatively, the semiconductor optical element 21 is, for example, a semiconductor light emitting element such as a surface emitting semiconductor laser diode. An upper electrode 27 of the semiconductor optical element 21 is electrically connected through a bonding wire W1 to the lead terminal 7. The semiconductor optical element 21 is mounted on the third conductive pattern 123 and a lower electrode 29 thereof is electrically connected through the third conductive pattern 123 and wire W2 to the lead terminal 9. The semiconductor optical element 21 is located on the third portion of the submount 11 and the insulating member 5 is located below the third portion of the submount 11 and below the semiconductor optical element 21. The third portion of the submount 11 is apart from the insulating member 5.

Figure 4:
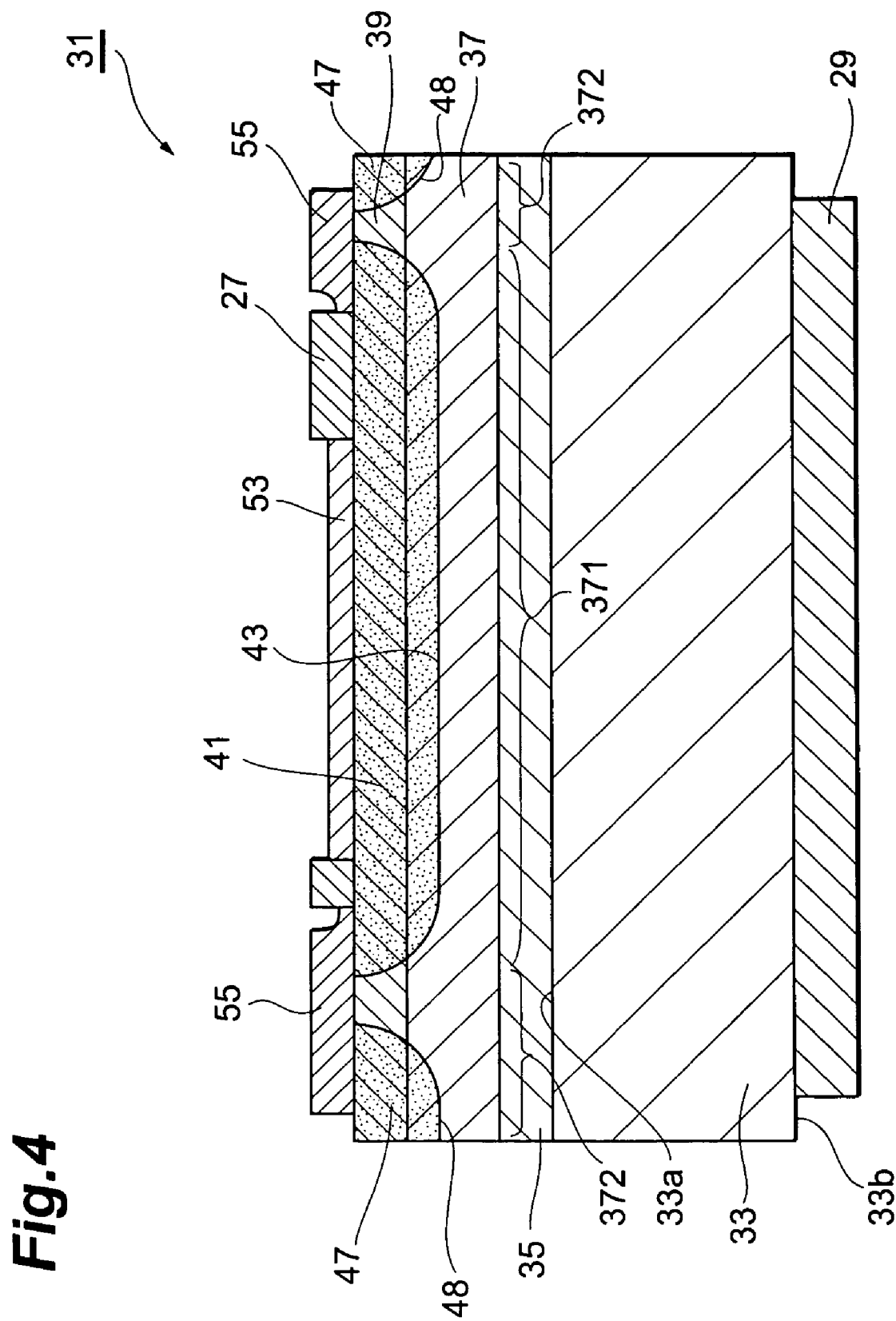
FIG. 4 is a sectional view showing a photodiode.

With reference to FIG. 4, a photodiode 31 used as the semiconductor optical element 21 will be described. The photodiode 31 has an n-InP substrate 33, an n-InP buffer layer 35, an n-InGaAs light receiving layer 37, and an n-InP window layer 39. The dark current in this photodiode 31 is low.

The n-InP buffer layer 35, n-InGaAs light receiving layer 37, and n-InP window layer 39 are provided in this order on the surface 33a of the n-InP substrate 33. The n-InGaAs light receiving layer 37 has a first region 371, and a second region 372 surrounding the first region 371. The photodiode 31 has a Zn diffusion layer 41 of the p-type provided in the first region 371. The dopant Zn is diffused in the n-InGaAs light receiving layer 37 and n-InP window layer 39 to form the Zn diffusion layer 41. The Zn diffusion layer 41 and the n-InGaAs light receiving layer 37 constitute a first pn junction 43.

The photodiode 31 has another p-type Zn diffusion layer 47 provided in the second region 372. The dopant Zn is diffused into the n-InGaAs light receiving layer 37 and n-InP window layer 39 to form another Zn diffusion layer 47. The other Zn diffused layer 47 and the n-InGaAs light receiving layer 37 constitute a second pn junction 48. A lower electrode 29 for an n-electrode is formed on the backside 33b of the n-InP substrate 33. An upper electrode 27 for a p-electrode, and an antireflection film 53 are formed on the upper surface of the Zn diffused layer 41. A passivation layer 55 is provided on the upper surface of the n-InP window layer 39. The passivation layer 55 can be used as a mask for the diffusion of zinc to form the Zn diffusion layer 41. Since Zn atoms diffuse laterally in this formation of the Zn diffusion layer 41, the Zn diffusion layer 41 is formed below the passivation layer 55.

In the photodiode 31, photocarriers contributing to a photocurrent are generated from light entering the first pn junction 43. Undesired photocarriers, which diffuse slowly, are generated from light incident into a region outside of the first pn junction 43. These undesired photocarriers are removed by the other Zn diffusion layer 47 of the second pn junction 48, thereby achieving fast responsiveness of the optical semiconductor apparatus 1.

Figure 5:
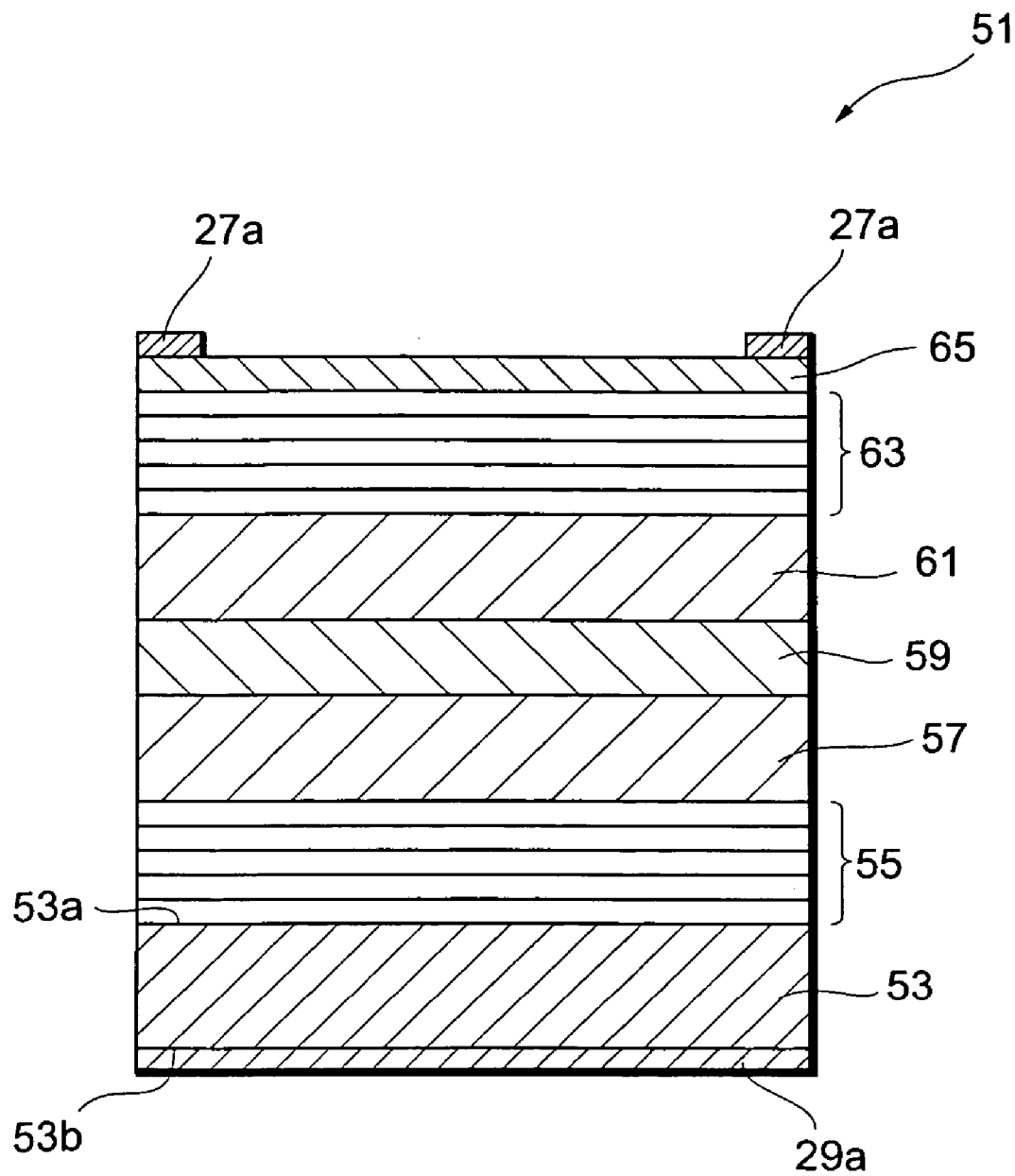
FIG. 5 is a sectional view showing a surface emitting semiconductor laser diode.

With reference to FIG. 5, a vertical cavity surface emitting semiconductor laser diode 51 used as the semiconductor optical element 21 will be described below. The surface emitting semiconductor laser diode 51 has a substrate 53, a DBR layer 55, a cladding layer 57, an active layer 59, a cladding layer 61, a DBR layer 63, and a contact layer 65. The DBR layer 55, cladding layer 57, active layer 59, cladding layer 61, DBR layer 63, and contact layer 65 are provided in order on the surface 53a of the substrate 53. An upper electrode 27a is provided on an upper surface of the contact layer 65. The upper electrode 27a is located in the edge region of the contact layer 65 and has an aperture for providing light emitted therethrough. A lower electrode 29a is provided on a backside 53b of the substrate 53. The active layer 59 has the quantum well structure. In this quantum well structure, barrier layers with a large bandgap and well layers with a small bandgap are alternately arranged. When the vertical cavity surface emitting semiconductor laser diode 51 is used as the semiconductor optical element 21, power consumption necessary for the light emitting element can be reduced. The combination of the materials for the barrier layers and well layers of the active layer 59 can be, for example, a combination of GaInNAs with GaAs, a combination of GaAsSb with GaAs, and so on. This structure of the active layer 59 provides the light emitting element suitable for long-wavelength band optical communications in 1.0–1.6 μm band.

The present embodiment describes the surface emitting semiconductor laser diode 51 having the active layer 59 of the quantum well structure as an example of the surface emitting semiconductor laser diode, but it is also possible to use another surface emitting semiconductor laser diode as the semiconductor optical element 21, for example, a surface emitting laser diode having the active layer of a quantum dot structure (e.g., GaInAs/GaAs quantum dot structure). This surface emitting laser diode can also be used as the low-power light emitting element that is suitable for long-wavelength-range optical communications in 1.0–1.6 μm bands.

If the surface emitting semiconductor laser diode is used as the semiconductor optical element 21, the material of the submount 11 is preferably aluminum nitride, CBN, vapor-phase synthetic diamond, or SiC and these materials have high thermal conductivities.

Subsequently, the operation of the optical semiconductor apparatus 1 including the semiconductor light receiving element as the semiconductor optical element 21 will be described. In the optical semiconductor apparatus 1, light from an optical transmission medium, e.g., an optical fiber, travels through the lens 25 and then entering the semiconductor optical element 21. The semiconductor optical element 21 generates an electric signal in response to the incident light. This electric signal is fed through the wires W1, W2 and lead terminals 7, 9 to the outside.

In the optical semiconductor apparatus 1, the semiconductor optical element 21 is mounted on the submount 11 and the eyelet 3 supports one end 11y and the other end 11z of the submount 11. Accordingly, although the force for die-bonding the semiconductor optical element 21 is exerted on the submount 11, the occurrence of plastic deformation of the submount 11 due to the force is reduced or suppressed, thereby preventing the position of the semiconductor optical element 21 from deviating off a desired range. In the optical semiconductor apparatus 1, heat from a heater which holds the eyelet 3 conducts through the eyelet 3 to the submount 11 and thus is readily transmitted to the adhesion layer during the die bond step of bonding the semiconductor optical element 21 onto the submount 11. Since deformation of the submount 11 is reduced, the ultrasonic wave for wire bonding is also readily transferred to the bonding portion. Consequently, it becomes feasible to properly control the production conditions in mounting the semiconductor optical element 21, and it improves the accuracy of the positional relationship between the semiconductor optical element 21 and lens 25, thereby achieving the desired operating characteristics of the optical semiconductor apparatus 1.

Since the first conductive pattern and the second conductive pattern are located apart from the third conductive pattern in the submount of the optical semiconductor apparatus 1, the capacitances from these conductive patterns of the submount can be made small. Therefore, the total capacitance of the optical semiconductor apparatus 1 becomes low, thereby achieving the fast response of the optical semiconductor apparatus 1.

EXAMPLE

Figure 6:
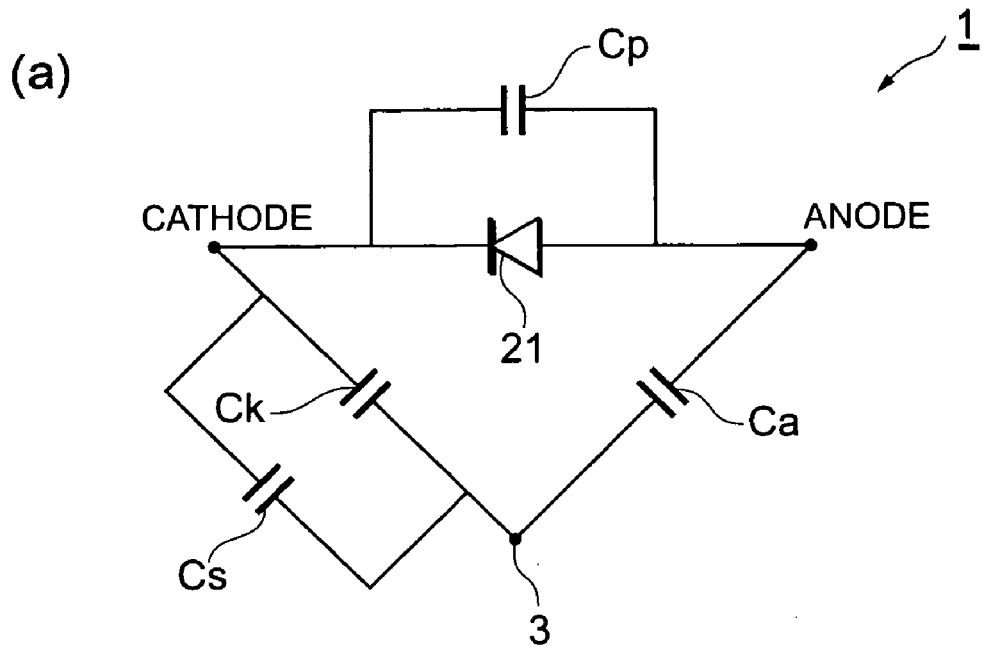
FIG. 6 shows equivalent circuit diagrams for the optical semiconductor apparatuses according to the embodiment and a comparative example, wherein area (a) shows an equivalent circuit diagram for the optical semiconductor apparatus according to the embodiment and area (b) shows an equivalent circuit diagram for the optical semiconductor apparatus according to the comparative example.
Figure 6:
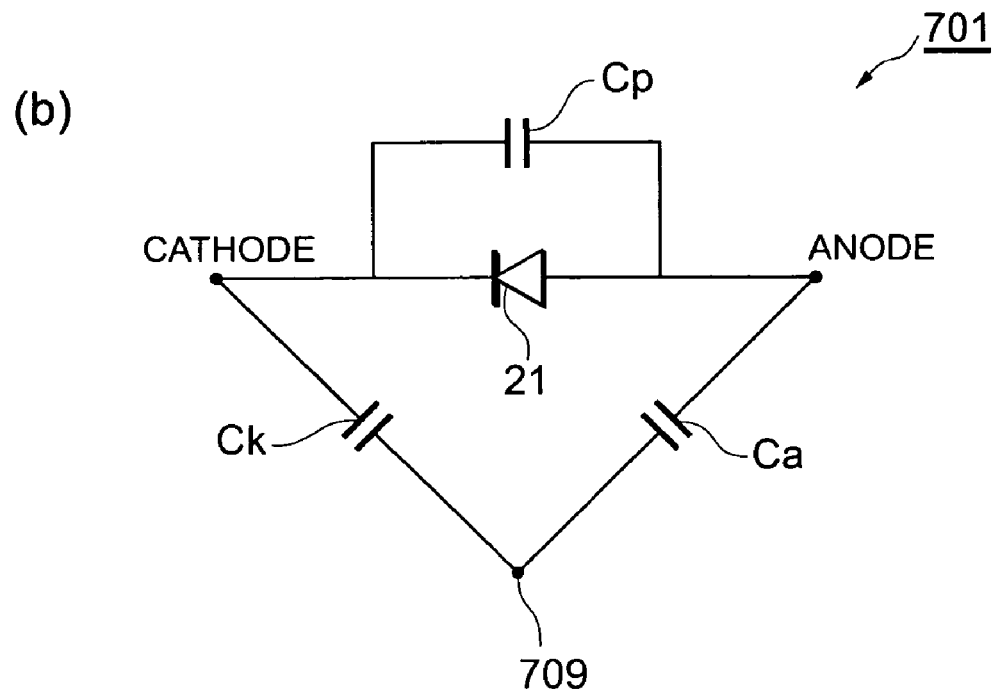

In the optical semiconductor apparatus 1, a PIN photodiode is used as the semiconductor optical element 21. This PIN photodiode has the light reception diameter of 80 μm and has the capacitance Cp of 0.34 pF under the reverse bias of 15 V. The capacitance Ca between the anode of the PIN photodiode and the eyelet 3 is 0.26 pF. The capacitance Ck between the cathode of the PIN photodiode and the eyelet 3 is 0.24 pf. Area (a) in FIG. 6 shows an equivalent circuit diagram representing the capacitances of the optical semiconductor apparatus 1. In this equivalent circuit diagram, symbol Cs indicates both capacitance between the first conductive pattern 121 and the third conductive pattern 123 of the submount 11 and capacitance (pF) between the second conductive pattern 122 and the third conductive pattern 123. According to the equivalent circuit diagram, the total parasitic capacitance C (pF) of the package of the optical semiconductor apparatus 1 is represented by the following equation:

$$C=0.34+(1/(0.24+Cs)+1/0.26)^{-1} \quad (Eq. 1)$$

According to Eq. 1, the total parasitic capacitance C is calculated as follows:

Cs=0.3 pF, C=0.524 pF;

Cs=0.2 pF, C=0.503 pF;

Cs=0.1 pF, C=0.487 pF;

Cs=0.08 pF, C=0.483 pF.

COMPARATIVE EXAMPLE

Figure 7:
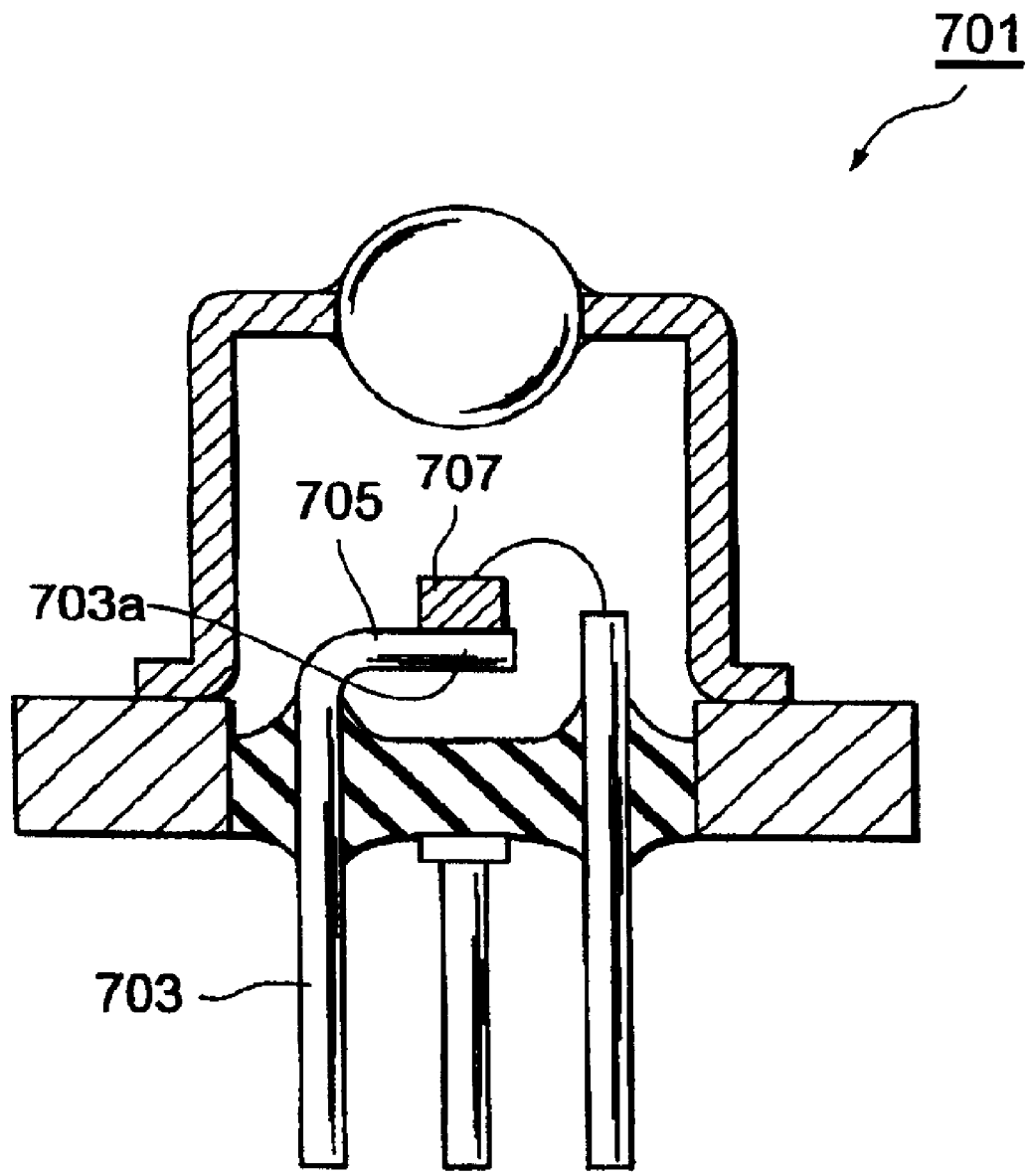
FIG. 7 is a sectional view showing a conventional optical semiconductor apparatus.

In an optical semiconductor apparatus having the structure of the conventional optical semiconductor apparatus 701 shown in FIG. 7, a PIN photodiode similar to that in the above example is used as the semiconductor optical element 707. The capacitance Ca between the anode of the PIN photodiode and the eyelet 709 is 0.26 pF, and the capacitance Ck between the cathode of this PIN photodiode and the eyelet 709 is 0.24 pF. Area (b) in FIG. 6 shows an equivalent circuit diagram representing the capacitances in this optical semiconductor apparatus for the comparative example. According to this equivalent circuit diagram, the total parasitic capacitance C (pF) of the package of the optical semiconductor apparatus for the comparative example is calculated as follows:

$$C=0.34+(1/0.24+1/0.26)^{-1}=0.465 \text{ pF}.$$

In the optical semiconductor apparatus 1 of the above example, if the capacitance Cs associated with the submount 11 is reduced to not more than 0.08 pF, the total capacitance concerning the package is kept not more than 0.483 pF without large capacitance increase as compared with the corresponding capacitance of 0.456 pF in the comparative example. For this reason, the optical semiconductor apparatus 1 of the above example is able to secure the operating frequency bandwidth of 860 MHz in the condition of output fluctuation ±1 dB, and enables transmission of 80 channels or more for optical CATV.

What is claimed is:

1. An optical semiconductor apparatus comprising:
   an eyelet having a through hole;
   an insulating member provided in the through hole, the insulating member supporting a plurality of lead terminals;
   a submount having a first portion supported by the eyelet, a second portion supported by the eyelet, and a third portion provided between the first portion and the second portion, the third portion being located on the insulating member; and
   a semiconductor optical element mounted on the third portion of the submount.

2. The optical semiconductor apparatus according to claim 1, further comprising an additional lead terminal electrically connected to the eyelet.

3. The optical semiconductor apparatus according to claim 1, wherein the submount has:
   a first face supported by the eyelet;
   a second face opposite to the first face;
   a first conductive pattern provided on the first face in the first portion;
   a second conductive pattern provided on the first face in the second portion; and
   a third conductive pattern provided on the second face in the third portion, and
   wherein the semiconductor optical element is provided on the third conductive pattern.

4. The optical semiconductor apparatus according to claim 3, wherein a sum of a capacitance between the first conductive pattern and the third conductive pattern of the submount and a capacitance between the second conductive pattern and the third conductive pattern of the submount is not more than 0.08 pF.

5. The optical semiconductor apparatus according to claim 1, wherein the submount is made of aluminum nitride.

6. The optical semiconductor apparatus according to claim 1, wherein the submount is made of cubic boron nitride.

7. The optical semiconductor apparatus according to claim 1, wherein the submount is made of diamond.

8. The optical semiconductor apparatus according to claim 1, wherein the submount is made of silicon carbide.

9. The optical semiconductor apparatus according to claim 1, wherein the submount is made of alumina.

10. The optical semiconductor apparatus according to claim 1, wherein the submount is made of single crystal silicon.

11. The optical semiconductor apparatus according to claim 1, wherein the submount is made of glass.

12. The optical semiconductor apparatus according to claim 1, wherein the semiconductor optical element is a PIN photodiode.

13. The optical semiconductor apparatus according to claim 1, wherein the semiconductor optical element is an avalanche photodiode.

14. The optical semiconductor apparatus according to claim 12, wherein the semiconductor optical element has an InGaAs light receiving layer.

15. The optical semiconductor apparatus according to claim 13, wherein the semiconductor optical element has an InGaAs light receiving layer.

16. The optical semiconductor apparatus according to claim 14, wherein the semiconductor optical element has an InP substrate, an InP buffer layer provided between the InP substrate and the InGaAs light receiving layer, and an InP window layer provided on the InGaAs light receiving layer.

17. The optical semiconductor apparatus according to claim 15, wherein the semiconductor optical element has an InP substrate, an InP buffer layer provided between the InP substrate and the InGaAs light receiving layer, and an InP window layer provided on the InGaAs light receiving layer.

18. The optical semiconductor apparatus according to claim 14, wherein the InGaAs light receiving layer of the semiconductor optical element has a first region, and a second region surrounding the first region, and
wherein the semiconductor optical element comprises a first pn junction located in the first region, and a second pn junction located in the second region.

19. The optical semiconductor apparatus according to claim 15, wherein the InGaAs light receiving layer of the semiconductor optical element has a first region, and a second region surrounding the first region, and
wherein the semiconductor optical element comprises a first pn junction located in the first region, and a second pn junction located in the second region.

20. The optical semiconductor apparatus according to claim 1, wherein the semiconductor optical element is a vertical cavity surface emitting laser diode.

21. The optical semiconductor apparatus according to claim 20, wherein the surface emitting laser diode includes an active layer having a GaInNAs/GaAs quantum well structure.

22. The optical semiconductor apparatus according to claim 20, wherein the surface emitting laser diode includes an active layer having a GaAsSb/GaAs quantum well structure.

23. The optical semiconductor apparatus according to claim 20, wherein the surface emitting laser diode includes an active layer having a GaInAs/GaAs quantum dot structure.

24. The optical semiconductor apparatus according to claim 3, wherein the first face in the third portion of the submount is spaced apart from the insulating member.

25. The optical semiconductor apparatus according to claim 1, wherein one lead terminal of the plurality of lead terminals is connected to the semiconductor optical element, and
wherein another lead terminal of the plurality of lead terminals is connected to the third conductive pattern.

26. The optical semiconductor apparatus according to claim 1, further comprising:
a lens optically coupled to the semiconductor optical element; and
a cap mounted on the eyelet, the cap holding the lens, the third portion of the submount being located between the lens and the third portion of the insulating member, and the third portion of the submount being spaced apart from the third portion of the insulating member.

27. The optical semiconductor apparatus according to claim 1, wherein the submount further includes a fourth portion provided between the first portion and the third portion, and a fifth portion provided between the second portion and the third portion,
wherein the first to fifth portions constitute a base of the submount,
wherein the base is made of an insulating material, and
wherein the insulating material of the base is exposed in surfaces of the fourth and fifth portions.

* * * * *